INVENTORS
LEON I. MAISSEL
NORMAN W. SILCOX
CHARLES L. STANDLEY
BY Bertram M. Mullin
ATTORNEY 3,190,819
PROCESS FOR MAKING CAPACITORS AND CAPACITIVE CIRCUIT ELEMENTS Leon I. Maissel and Norman W. Silcox, Poughkeepsie, and Charles L. Standley, Wappingers Falls, N.Y., assignors to International Business Machines Corporation, New York, N.Y., a corporation of New York Filed June 28, 1963, Ser. No. 291,420
3 Claims. (Cl. 204—38)

This invention relates to thin film capacitors, and in particular, to an improved process for making thin film capacitors utilizing an anodically grown film as the dielectric.

Recent developments with two-dimensional capacitors formed from anodically oxidized refractory metal film has facilitated a unified approach to the micro-miniaturization of electronic networks. These two-dimensional capacitors, more generally termed thin film capacitors, are formed by placing a thin film of anodizable metal on an insulating substrate, anodizing a portion of the anodizable metal to form a dielectric oxide layer and thereafter placing a second metal film on the oxide layer to form the upper plate of the capacitor. Properties achieved with these capacitors are: low leakage current, low dissipation factor, high dielectric strength and high capacitance per unit area.

Limitations are encountered in the type of substrate on which these circuit elements may be formed. As a result of the reliability requirements for these units, it has not been possible to anodize refractory metal to form the desired dielectric layer except when deposited on the smoothest of substrates, substrates having surfaces with a peak to valley distance of about six microinches or less, such as glass or glazed surfaces. Capacitors formed on rough ceramic substrates, such as alumina, steatite, magnesia and beryl, have invariably exhibited short circuits. Attempts made to overcome the foregoing difficulties and other disadvantages, none, as far as it is known, have been successful when carried into practice commercially on an industrial scale. It has been the object of considerable research, therefore, to find the reason for this apparent inconsistency and a solution thereto.

It has now been discovered that thin film capacitors are provided on rough ceramic substrates free of short circuits when the dielectric layers are formed to a thickness in the order of two hundred Angstroms or less, by an anodization process, where the polarity of the formation voltage is momentarily reversed after the applied voltage has approached its constant value for the formation of the dielectric film. Although voltage reversal techniques have been used before, they have been employed in the electrodeposition of metal films where repeated or continuous reversals are required. Polarity reversals of this nature do not provide the advantages referred to here.

It is an object of this invention to provide an improved process for making thin film capacitors of the two-dimensional circuitry type on rough ceramic substrates.

It is another object of this invention to provide an improved process for anodizing continuous thin films of oxide for application as dielectric media in two-dimensional electronic networks.

It is still a further object of this invention to provide a commercially feasible means for increasing the reliability and yield in the manufacture of thin film capacitors.

The foregoing and other objects, features and advantages of the invention will be apparent from the following more particular description of preferred embodiments of the invention as illustrated in the accompanying drawings.

Figure 1:
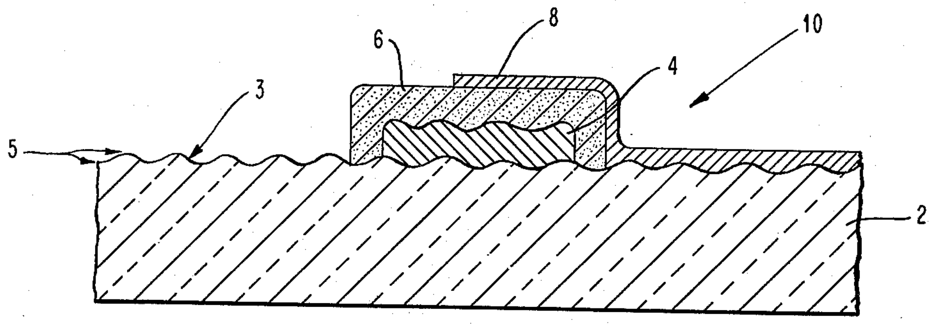
FIGURE 1 is a cross-sectional view of the capacitor produced in accordance with the present invention.

With reference now more particularly to the drawings, FIGURE 1 shows a schematic representation of a thin film capacitor 10 with a ceramic substrate 2 having a peak to valley distance 5 between thirty-five to one hundred microinches. Anodizable metal 4 is deposited to a thickness between ten to fifty microinches on ceramic surface 3 by any of the conventional metal depositing techniques such as cathode sputtering, vacuum evaporation and electroplating. In the formation of film 4, anodizable metal such as tantalum, niobium, titanium and bismuth are preferred.

Figure 2:
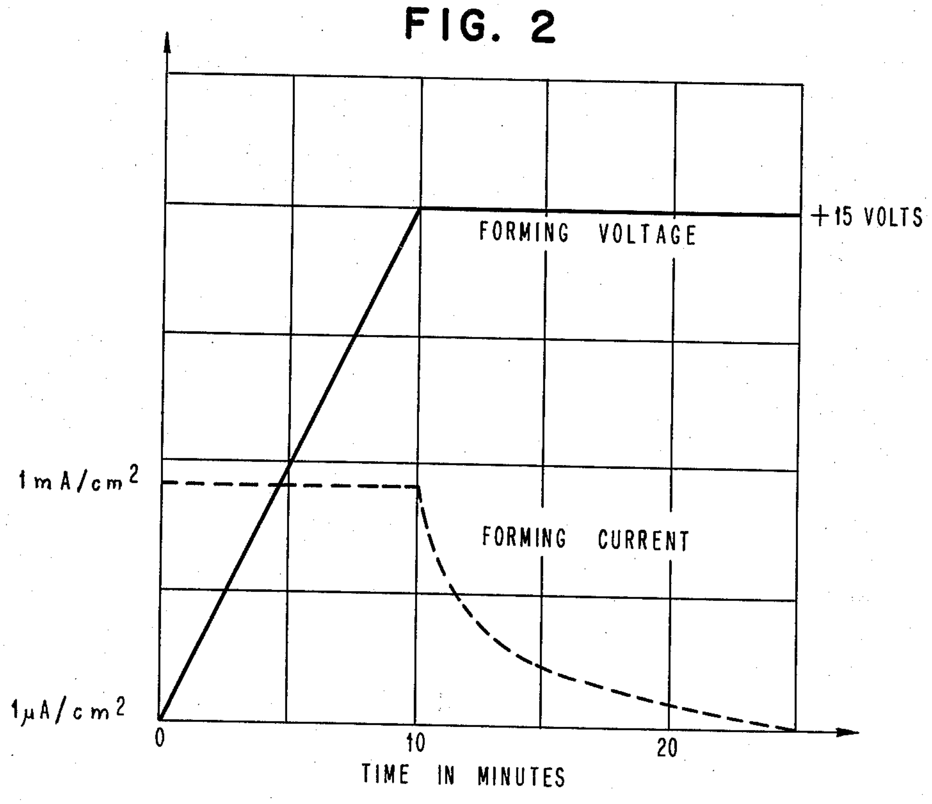
FIGURE 2 is a plot of formation voltage and formation current versus time in the anodization process.

Following the deposition of refractory film 4 on ceramic substrate 2, dielectric film 6 is formed by immersing metal film 4 as the anode in a typical anodization electrolysis cell: a positive bias is applied to the metal film with respect to another electrode immersed in the electrolyte. The positive bias is maintained until the anodization formation voltage approaches a constant value. As indicated in FIGURE 2 of the drawings, the formation voltage approaches a constant value when the anodizing current levels off, which, as brought out by the figure, usually occurs ten to twenty minutes after the process has commenced. At that time the polarity of the formation voltage is momentarily reversed, for a period of thirty seconds or so, to a value approximately one-half of the initially applied potential such as to make the metal film cathodic. Although the magnitude of the applied reversed voltage, and, the duration of its application, may exceed the values stated, it has been found that deleterious effects are experienced when the reversed voltage approaches the original value of the applied voltage and the duration of its application exceeds two minutes (120 seconds).

The normal positive bias is then re-applied by changing the polarity of the applied voltage to its normal sign and the process continued until oxide film 6 develops a thickness in the order of two hundred Angstroms or so. After the completion of the anodization, a counter electrode 8 of a suitable metal such as gold, tin, zinc or aluminum having a thickness in the order of several thousand Angstroms is deposited over oxide 6 by vacuum evaporation.

With the reversal of polarity in the anodizing procedure, it becomes practical to use ceramic substrates with rough surfaces having a peak to valley distance between thirty-five to one hundred microinches, in comparison to previously used substrates where the peak to valley distance is in the order of six microinches. Table I below compares the yield of capacitors formed on ceramic substrates to various voltages with and without the use of the reversal technique. From the data it is seen that the yield is greatly increased with the application of the reversal technique but that the effect achieved below 15 volts diminishes at higher voltages.

*Table I*

| Formation Voltage of Oxide in Volts | Yield With Reversal, percent | Yield Without Reversal, percent |
|---|---|---|
| 8 | 80 | 30 |
| 12 | 80 | 25 |
| 16 | 45 | 12 |
| 20 | 20 | 15 |
| 25 | 20 | 0 |
| 30 | 10 | 0 |

It is not clear why the momentary reversal of the polarity of the applied voltage during the anodization process makes it possible to form thin film capacitors on ceramic substrates having a roughness with a peak to valley distance of thirty-five to one hundred microinches. Nor is it clear why the application of the technique is limited to thin film capacitors. However, some tests have indicated a provisional or working hypotheses.

When anodizable metal is converted to oxide, a lattice mis-match develops. Table II brings this out.

*Table II*

| | Density | Molecular Weight | Molar Volume | Mismatch Ratio |
|---|---|---|---|---|
| Tantalum (Ta) | 16.6 | 180.9 | 11.4 | 2.2 |
| Tantalum Oxide ($Ta_2O_5$) | 8.7 | 441.8 | 50.8 | |
| Niobium (Nb) | 8.6 | 92.9 | 10.8 | 2.55 |
| Niobium Oxide ($Nb_2O_5$) | 4.8 | 265.8 | 55.3 | |
| Bismuth (Bi) | 9.8 | 209.0 | 21.2 | 2.0 |
| Bismuth Oxide ($Bi_2O_3$) | 5.6 | 466.0 | 83.2 | |
| Titanium (Ti) | 4.5 | 47.9 | 10.6 | 1.8 |
| Titanium Oxide ($TiO_2$) | 4.26 | 79.9 | 18.8 | |

This lattice mis-match is of no importance when a completely smooth metal film is oxidized, since the oxide grows in a uniform manner both into as well as out of the metal in such a way that the ratio of the oxide thickness to the thickness of the metal that has been consumed by the oxidation equals the ratio of the molar volume. If, however, there is a rough spot on the surafce this is no longer true. As a result of the greater electric field strength in the vicinity of the rough spot, the spot anodizes more rapidly than the smooth portions of the surface around it. As the oxide grows thicker it tends to smooth out rather than follow the original roughness contour. Complete smoothing occurs at about 60 volts of formation voltage. The net result of all this is that wherever there was a rough spot in the original film, more material than was there before is packed into a given volume; this is the source of considerable stress in the oxide film which the latter relieves only by cracking. The tendency toward the formation of cracks is a function of the macroscopic structure of the ceramic surface and has been determined to be the source of the short circuits.

It is found that the stress in the oxide film is minimized if the thickness of the film is limited to a depth in the order of two hundred Angstroms or less which, at room temperature, corresponds to a formation voltage of about 15 volts. In anodizing films at low voltages, to form the desired thickness, the yield of the units is very low as a result of passivation taking place at various spots along the surface of the refractory metal. Oxidation does not take place at these passivated areas which subsequently gives birth to the short circuits obtained in the finished capacitor.

By reversing the polarity of the sign of the applied voltage, momentarily, when the formation voltage approaches a constant value, it is possible to activate the passivated areas so as to permit growth of the oxide film there. With the reversal technique, continuous films free from short circuits are produced.

More specifically as to the procedure used in the making of the capacitor, a ceramic substrate such as alumina is first cleaned. The cleaning entails the following: immersing the substrate in a solution of boiling detergent, rinsing in water, boiling again in hydrogen peroxide (15% by volume solution), rinsing again in water, washing in isopropyl alcohol and vapor degreasing in isopropyl alcohol.

A anodizable metal, such as tantalum, is next deposited on the substrate surface, for example, by cathode sputtering. The films are deposited in an argon glow discharge (3000 v. at 1 ma./cm.$^2$) at a pressure of sixty microns at a rate of about ten Angstroms per second generally for about fifteen minutes. Such films have sheet resistivities of about 4 ohms per square.

The substrate is then immersed in an anodizing bath such that the film serves as the anode of the electrical circuit. Anodization is accomplished in an appropriate electrolyte which does not dissolve the metal oxide layer as it is formed. A convenient solution for this purpose is freshly prepared 1% by weight aqueous solution of ammonium tetraborate. Although 1% of any solution such as sodium sulphate, sulfuric acid, phosphoric acid, sodium citrate or citric acid may be used. The temperature of the electrolyte, during anodization, is maintained approximately at room temperature, and the current density between 0.1 to 1 milliampere per square centimeter of anode area until the formation voltage is reached.

The oxide layer is anodically formed on the tantalum film with a constant current density while the voltage across the growing oxide is raised to the desired forming voltage. As brought out by FIGURE 2, with an initial formation current density of about 1 milliampere per square centimeter of anode area, the formation current levels off to a value of about 1 microampere per square centimeter of anode area as the forming voltage is raised to its desired forming voltage of about 15 volts. At this constant voltage, the forming process continues, demonstrated by the decrease of the leakage current down to the microampere range. But when the formation voltage approaches or reaches this constant value, and, when the formation current begins to asymptotically level off, the polarity of the applied voltage is reversed for about thirty seconds such as to make the metal film the cathode in the electrolyte. This activates the areas resistant to the formation of oxide. After this brief reversal in polarity, the normal polarity is resumed with an applied voltage of about 7.5 volts and the process continued until an oxide layer of about two hundred Angstroms in thickness is formed.

After the oxide film is grown to the desired depth, a counter electrode of electrically conductive metal is deposited by evaporating aluminum through an appropriate mask onto the surface of the tantalum oxide dielectric layer, the counter electrode being deposited to a thickness of a thousand Angstroms or so. In this manner capacitive circuit elements are formed on rough ceramic surfaces having a peak to valley distance greater than six microinches, thereby overcoming substrate limitations heretofore not possible in the art.

It appears that a formation voltage of about 15 volts is the optimum voltage for forming the dielectric film which corresponds to a film thickness in the order of two hundred Angstroms. Although the 15 volts is the optimum upper limit for forming the dielectric film, higher voltages are usable but at the expense of lower yields from the process.

What has been described is a technique for forming thin film capacitors on rough ceramic substrates for application in two-dimensional circuitry networks. With the application of a single reversal of the polarity of the applied formation voltage, continuous films of dielectric media are formed on an anodizable metal such as to enable the fabrication of capacitors free from short circuits.

While there have been shown and described and pointed out the fundamental novel features of the invention as applied to a preferred embodiment, it will be understood that various omissions and substitutions and changes in form and detail illustrated in the procedure may be made by those skilled in the art without departing from the spirit of the invention.

What is claimed is:

1. In the process for making capacitive circuit elements on insulating ceramic surfaces, where said ceramic surfaces have a roughness profile characterized by a peak to valley distance greater than 6 microinches, the steps comprising:

depositing tantalum film on said ceramic surface;

inserting said deposited tantalum film as the anode in an electrolysis cell;

applying an anodizing voltage to electrolytically generate oxygen at said film surface to form an oxide layer thereon; increasing the anodizing voltage while the anodizing current density is essentially level, said voltage being increased up to a value of 15 volts; and, maintaining said anodizing voltage, at said level of 15 volts, for a period of approximately 10 to 20 minutes;

reversing the polarity of said anodizing voltage for a period between about 30 seconds to 120 seconds;

reapplying said anodizing voltage and maintaining said anodizing voltage at a level of less than 15 volts until an oxide layer of about 200 Angstroms is formed on the surface of said tantalum film; and, thereafter, depositing a metal counter-electrode on the anodized surface of said tantalum.

2. In the process for making capacitive circuit elements on insulating ceramic surfaces, where said ceramic surfaces have a roughness profile characterized by a peak to valley distance greater than 6 microinches, the steps comprising:

depositing an anodizable metal film selected from the group consisting of tantalum, niobium, bismuth and titanium on said ceramic surface;

inserting said deposited anodizable metal film as the anode in an electrolysis cell;

applying an anodizing voltage to electrolytically generate oxygen at said film surface to form an oxide layer thereon;

increasing the anodizing voltage, while the anodizing current density is essentially level, said voltage being increased up to a level of 15 volts; and maintaining said anodizing voltage at said level until said anodizing current density asymptotically approaches zero;

reversing the polarity of said anodizing voltage for a period between about 30 seconds to 120 seconds;

reapplying said anodizing voltage and maintaining said anodizing voltage at a level of less than 15 volts until an oxide layer of about 200 Angstroms is formed on the surface of said anodizable metal film; and, thereafter, depositing a metal counter-electrode on the anodized surface of said anodizable metal film.

3. In the process for making capacitive circuit elements on insulating ceramic surfaces, where said ceramic surfaces have a roughness profile characterized by a peak to valley distance greater than 6 microinches, the steps comprising:

depositing an anodizable metal film on said ceramic surface;

inserting said anodizable metal film as the anode in an electrolysis cell;

applying an anodizing voltage to electrolytically generate oxygen at said film surface to form an oxide layer thereon; increasing the anodizing voltage while the anodizing current density is essentially level, said voltage being increased up to a value of 15 volts; and maintaining said anodizing voltage at said level until said anodizing current density asymptotically levels off to approach zero;

reversing the polarity of said anodizing voltage for a period between about 30 seconds to 120 seconds;

reapplying said anodizing voltage and maintaining said anodizing voltage at a level of less than 15 volts until an oxide layer of about 200 Angstroms is formed on the surface of said film; and, thereafter, depositing a metal counter-electrode on the anodized surface of said anodizable metal.

References Cited by the Examiner

UNITED STATES PATENTS

| | | | |
|---|---|---|---|
| 2,647,079 | 7/53 | Burnham | 204—38.1 |
| 2,666,023 | 1/54 | Schaaber. | |
| 2,901,412 | 8/59 | Mostovych et al. | 204—228 |
| 2,930,741 | 3/60 | Burger et al. | 204—228 |
| 3,023,149 | 2/62 | Zeman | 204—228 |
| 3,085,052 | 4/63 | Sibert | 204—38.1 |

WINSTON A. DOUGLAS, *Primary Examiner.*

MURRAY TILLMAN, *Examiner.*